(12) United States Patent
Takeuchi et al.

(10) Patent No.: US 12,261,544 B2
(45) Date of Patent: Mar. 25, 2025

(54) POWER CONVERTER

(71) Applicant: DENSO CORPORATION, Kariya (JP)

(72) Inventors: Kazuya Takeuchi, Kariya (JP); Yuuta Hashimoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 190 days.

(21) Appl. No.: 17/878,585

(22) Filed: Aug. 1, 2022

(65) Prior Publication Data

US 2022/0368241 A1 Nov. 17, 2022

Related U.S. Application Data

(63) Continuation of application No. PCT/JP2020/046765, filed on Dec. 15, 2020.

(30) Foreign Application Priority Data

Feb. 3, 2020 (JP) ................................. 2020-016456

(51) Int. Cl.
*H02M 7/48* (2007.01)
*H02M 7/00* (2006.01)
*H05K 7/02* (2006.01)
*H05K 7/20* (2006.01)
*H05K 9/00* (2006.01)

(52) U.S. Cl.
CPC ............ *H02M 7/003* (2013.01); *H02M 7/48* (2013.01); *H05K 7/02* (2013.01); *H05K 7/20* (2013.01); *H05K 9/0081* (2013.01)

(58) Field of Classification Search
CPC ........... H02M 7/003; H05K 7/02; H05K 7/20; H05K 9/0081
See application file for complete search history.

(56) References Cited

U.S. PATENT DOCUMENTS

| | | | |
|---|---|---|---|
| 7,508,668 B2 * | 3/2009 | Harada | ................. H01L 23/473 361/689 |
| 12,021,459 B2 * | 6/2024 | Awamori | ................ H02M 1/44 |
| 2014/0192577 A1 | 7/2014 | Shin et al. | |
| 2016/0081233 A1 | 3/2016 | Nagasawa et al. | |
| 2022/0013298 A1 | 1/2022 | Urano et al. | |

(Continued)

FOREIGN PATENT DOCUMENTS

| | | |
|---|---|---|
| JP | 2014-082274 A | 5/2014 |
| JP | 2014-192936 A | 10/2014 |

(Continued)

*Primary Examiner* — Adolf D Berhane
(74) *Attorney, Agent, or Firm* — Oliff PLC

(57) ABSTRACT

A power converter includes semiconductor modules, a capacitor, a circuit board, a casing, a busbar and a shield layer. The capacitor is electrically connected to the semiconductor modules. The casing accommodates the circuit board, the semiconductor modules and the capacitor. The busbar has an input terminal portion, an output terminal portion and an electric pathway connecting the input terminal portion and the output terminal portion. The electric pathway is connected to at least one of electronic components including the semiconductor modules and the capacitor. The busbar has a built-in portion incorporated into the casing. The shield layer is electrically conductive and provided on an inner surface or an outer surface of the casing such that the shield layer covers the built-in portion.

17 Claims, 4 Drawing Sheets

(56) References Cited

U.S. PATENT DOCUMENTS

2022/0368242 A1\* 11/2022 Murakami .......... H02M 7/5387
2023/0109756 A1\* 4/2023 Yamazaki ............. H02M 7/003
361/699

FOREIGN PATENT DOCUMENTS

| JP | 2015-211600 A | 11/2015 |
| --- | --- | --- |
| JP | 2019-003893 A | 1/2019 |
| JP | 2021-125925 A | 8/2021 |
| JP | 2023-040439 A | 3/2023 |

\* cited by examiner

POWER CONVERTER

CROSS REFERENCE TO RELATED APPLICATIONS

The present application is a continuation application of International Patent Application No. PCT/JP2020/046765 filed on Dec. 15, 2020, which designated the U.S. and claims the benefit of priority from Japanese Patent Application No. 2020-016456 filed on Feb. 3, 2020. The entire disclosures of all of the above applications are incorporated herein by reference.

TECHNICAL FIELD

The present disclosure relates to a power converter.

BACKGROUND

A power converter includes a busbar. The busbar is electrically connected to a positive electric potential of a battery and built in a resin case.

SUMMARY

According to at least one of embodiment, a power converter includes semiconductor modules, a capacitor, a circuit board, a casing, a busbar and a shield layer. The capacitor is electrically connected to the semiconductor modules. The casing accommodates the circuit board, the semiconductor modules and the capacitor. The busbar has an input terminal portion, an output terminal portion and an electric pathway connecting the input terminal portion and the output terminal portion. The electric pathway is connected to at least one of electronic components including the semiconductor modules and the capacitor. The busbar has a built-in portion incorporated into the casing. The shield layer is electrically conductive and provided on an inner surface or an outer surface of the casing such that the shield layer covers the built-in portion.

BRIEF DESCRIPTION OF DRAWING

The details of one or more embodiments are set forth in the accompanying drawings and the description below. Other features and advantages will be apparent from the description and drawings, and from the claims.

DETAILED DESCRIPTION

Figure 1:
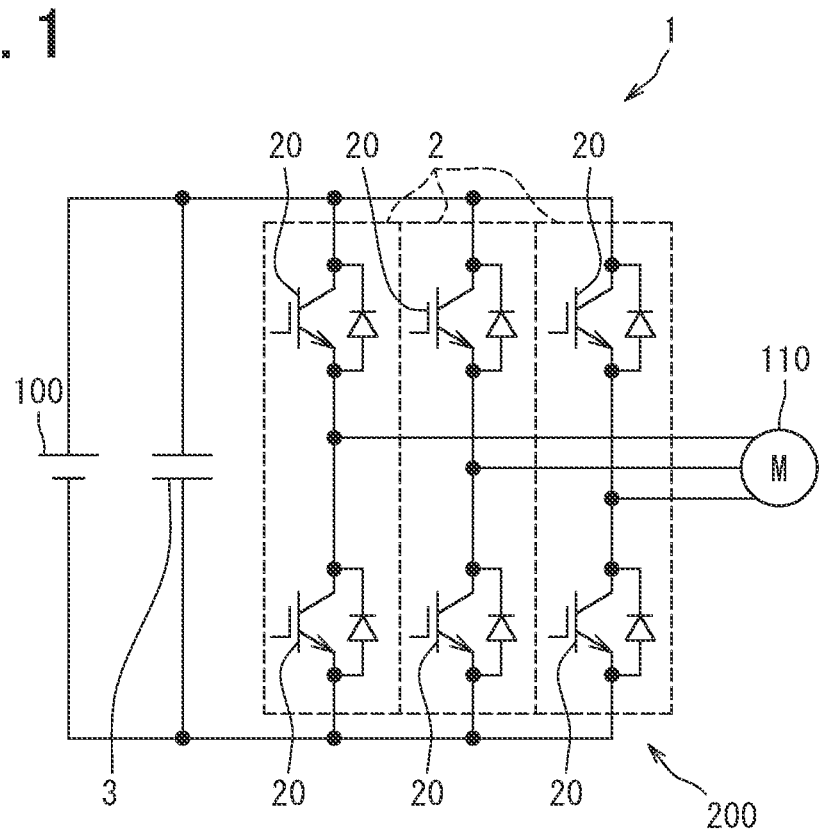
FIG. 1 is a circuit diagram of a power converter according to a first embodiment.

To begin with, examples of relevant techniques will be described.

A power converter according to a comparative example includes a busbar. The busbar is electrically connected to a positive electric potential of a battery and built in a resin case.

According to the comparative example, a current flows through the busbar built in the resin case at a high voltage. Therefore, an electromagnetic noise from the busbar may cause a malfunction in a circuit board inside the resin case or a peripheral device outside the resin case.

In contrast, according to an aspect of the present disclosure, a power converter includes semiconductor modules, a capacitor, a circuit board, a casing, a busbar and a shield layer. The capacitor is electrically connected to the semiconductor modules. The casing accommodates the circuit board, the semiconductor modules and the capacitor. The busbar has an input terminal portion, an output terminal portion and an electric pathway connecting the input terminal portion and the output terminal portion. The electric pathway is connected to at least one of electronic components including the semiconductor modules and the capacitor. The busbar has a built-in portion incorporated into the casing. The shield layer is electrically conductive and provided on an inner surface or an outer surface of the casing such that the shield layer covers the built-in portion.

According to this power converter, since the busbar is a current path, the built-in portion of the busbar incorporated in the casing can emit an electromagnetic noise. In this power converter, electromagnetic noises from various noise sources can propagate through the busbar and be emitted from the busbar. However, the shield layer is provided on the inner surface or the outer surface of the casing such that the shield layer covers the built-in portion. Therefore, the shield layer can prevent emission or diffusion of an electromagnetic noise or the like from the busbar via the casing. This power converter can suppress a propagation of the electromagnetic noise or the like in air from the busbar through the casing. Therefore, the power converter is capable of reducing noise interference to, for example, the circuit board or a peripheral device outside the casing.

Hereinafter, embodiments for implementing the present disclosure will be described referring to the drawings. In each embodiment, portions corresponding to the elements described in the preceding embodiments are denoted by the same reference numerals, and redundant explanation thereof may be omitted. When only a part of a configuration is described in an embodiment, the other preceding embodiments can be applied to the other parts of the configuration. It may be possible not only to combine parts the combination of which is explicitly described in an embodiment, but also to combine parts of respective embodiments the combination of which is not explicitly described if any obstacle does not especially occur in combining the parts of the respective embodiments.

First Embodiment

A first embodiment showing an example of a power converter will be described with reference to FIGS. 1 and 2. The power converter can be applied to an in-vehicle power conversion device mounted on a vehicle such as an electric vehicle or a hybrid vehicle. The power converter capable of achieving the object disclosed in the specification can be applied to, for example, an inverter device, or a converter device. In this embodiment, the power converter applied to the inverter device will be described below.

The power converter 1 includes an inverter circuit 200. As shown in FIG. 1, the inverter circuit 200 includes semiconductor modules 2. The semiconductor modules 2 include semiconductor elements 20 (e.g. insulated-gate bipolar transistor element). By switching the semiconductor elements 20, the inverter circuit 200 converts DC power (i.e. direct current power) supplied from a DC power supply 100 into AC power (i.e. alternating current power). The vehicle runs by driving a three-phase motor 110 using the obtained AC power.

Figure 2:
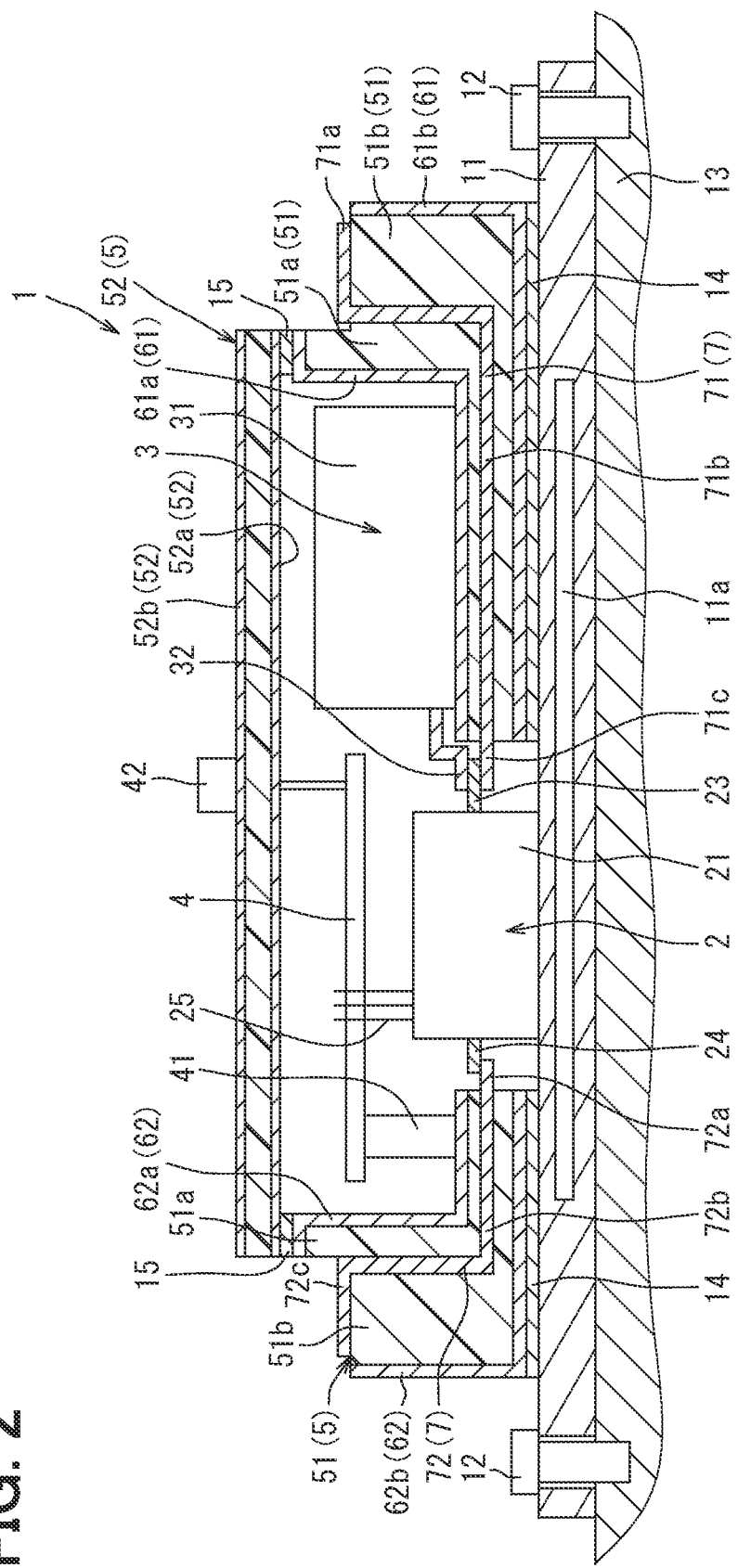
FIG. 2 is a cross-sectional view illustrating a configuration of the power converter according to the first embodiment.

As shown in FIG. 2, the power converter 1 includes the semiconductor modules 2, a capacitor 3, a circuit board 4, and a casing 5. The capacitor 3 is electrically connected to the semiconductor modules 2. The power converter 1 includes a cooling member 11 that cools the semiconductor modules 2. The cooling member 11 is in contact with the semiconductor modules 2 or thermally connected with the semiconductor modules 2 through a heat conductor. The cooling member 11 is in contact with the casing 5 or thermally connected with the casing 5 through a heat conductor. The cooling member 11 has a plate shape, and includes a flow path 11a in which a cooling fluid flows. The cooling member 11 is fixed to an installation support 13 by a fixing member 12 such as a screw, or a bolt. The installation support 13 includes, for example, a vehicle member and a motor device. The installation support 13 is an example of a mount to which the casing 5 is fixed. Since the installation support 13 is electrically connected to the ground via a peripheral member, the casing 5 is electrically grounded.

A cooling side seal 14 that is electrically conductive is interposed between a lower case 51 of the casing 5 and the cooling member 11. The cooling side seal 14 is provided at a joint between the lower case 51 and the cooling member 11. The cooling side seal 14 is a gasket electrically conductive and is deformed between the lower case 51 and the cooling member 11. The cooling side seal 14 seals the joint between the lower case 51 and the cooling member 11. The cooling side seal 14 is in contact with the base-side outer layers 61b, 62b. The base-side outer layers 61b, 62b will be described later. Since the cooling side seal 14 and the base-side outer layers 61b, 62b are electrically conductive, an electric current pass therebetween. The cooling side seal 14 may have thermal conductivity. The cooling side seal 14 may be a sheet shaped member, a grease, or a gel as long as the cooling side seal 14 is electrically conductive.

The casing 5 is a container for accommodating the circuit board 4, the semiconductor modules 2, and the capacitor 3, for example. The casing 5 is formed by combining case members. The casing 5 includes at least a first case member and a second case member. The first case member and the second case member are resin molded products. For example, the first case member is a lower case 51 that surrounds the circuit board 4, the semiconductor modules 2, the capacitor 3, and the like. The circuit board 4, the semiconductor modules 2, the capacitor 3, and the like are housed in an internal space of the casing 5, for example, in an internal space of the lower case 51. For example, the second case member is a cover 52 that is attached to the lower case 51 such that the cover 52 covers the internal space of the lower case 51. The cover 52 is fixed to and integrated with the lower case 51 such that the cover 52 is located over and covers the lower case 51. A cover-side seal 15 is provided at a joint between the cover 52 and the lower case 51. The cover-side seal 15 is a gasket electrically conductive and is interposed for sealing between the cover 52 and the lower case 51. The cover-side seal 15 may be a sheet shaped member, a grease, or a gel as long as the cover-side seal 15 is electrically conductive.

The internal space of the casing 5 is, for example, divided by a partition wall into a capacitor accommodating space and a semiconductor-module accommodating space. The semiconductor-module accommodating space houses the semiconductor modules 2 and the circuit board 4, for example.

The capacitor 3 is electrically connected to the semiconductor modules 2. The capacitor 3 functions as a smoothing capacitor that smooths a DC voltage applied to the semiconductor modules 2. The capacitor 3 includes a capacitor element, a sealing member 31, and a terminal 32. The capacitor element of the capacitor 3 is housed in a capacitor accommodating portion. The capacitor accommodating space is filled with the sealing member 31, and the sealing member 31 seals the capacitor element. The sealing member 31 in the capacitor accommodating space encloses the capacitor element. The sealing member 31 forms an exterior of the capacitor 3. The capacitor element is connected an electrode plate, for example. For example, a film capacitor can be adopted as the capacitor element.

The sealing member 31 is made of a thermosetting resin such as an epoxy resin. A gap between the capacitor element and the capacitor accommodating portion and a gap between a terminal 32 and the capacitor accommodating portion are filled with the sealing member 31. With this configuration, the sealing member 31 seals the capacitor element, the terminal 32, and the like. A part of the terminal 32 or the like protrudes from the sealing member 31.

When manufacturing the capacitor 3, the capacitor element is first housed in the capacitor accommodating space, and then an uncured sealing member 31 is injected into the capacitor accommodating space. Thereafter, the sealing member 31 is cured by a heat treatment to form the capacitor 3. Further, the capacitor 3 may include an outer case for accommodating the capacitor element. The capacitor 3 may have a configuration having a film covering the capacitor element as an exterior.

The semiconductor modules 2 each include a body 21 incorporating the semiconductor elements 20, a power terminal and a control terminal 25. The power terminal and the control terminal 25 protrude from the body 21. The semiconductor modules 2 are also called power modules. The power terminal includes an input terminal 23 to which DC voltage is applied, and an output terminal 24 connected to an output busbar 72 that is connected to the three-phase motor 110. The input terminal 23 is connected to the terminal 32 of the capacitor 3. Therefore, the input terminal 23 is electrically connected an output unit of the DC power supply 100 via an input busbar 71. The control terminal 25 is connected to the circuit board 4. The circuit board 4 constitutes a circuit board on which electronic components are mounted. The electronic components are, for example, arithmetic calculation elements controlling operations of the semiconductor elements 20. The circuit board 4 controls turning on and off of the semiconductor element 20. By switching the semiconductor element 20, the DC power supplied from the DC power supply 100 is converted into AC power.

The circuit board 4 is fixed in a state of being supported by a boss 41 provided in the lower case 51. The circuit board 4 is connected via wiring to a connector 42 protruding outward from the casing 5. The connector 42 can be connected to a peripheral device installed outside the power converter 1.

The power converter 1 includes busbars 7. The busbars 7 include the input busbar 71 and the output busbar 72. The busbars 7 are used for electric power input and output. The busbars 7 are electrically conductive. The busbars 7 each have an input terminal portion, an output terminal portion and an electric pathway connecting the input terminal portion and the output terminal portion. The busbars 7 are connected to an input side or an output side of at least one of components that include the semiconductor modules 2 and the capacitor 3.

The input busbar 71 includes a first terminal portion 71a, a built-in portion 71b and a second terminal portion 71c. The first terminal portion 71a is supplied with electric power from the DC power supply 100. The built-in portion 71b is incorporated into the lower case 51. The first terminal portion 71a and the second terminal portion 71c are exposed to an outside from the lower case 51. The second terminal portion 71c is electrically connected to the terminal 32 of the capacitor 3 and the input terminals 23 of the semiconductor modules 2.

The output busbar 72 includes a first terminal portion 72a, a built-in portion 72b and a second terminal portion 72c. The first terminal portion 72a is connected to the output terminal 24. The built-in portion 72b is incorporated into the lower case 51. The first terminal portion 72a and the second terminal portion 72c are exposed to the outside from the lower case 51. The second terminal portion 72c is a terminal that outputs electric power to the three-phase motor 110. The output busbar 72 is also an electric pathway for an output current that has been controlled by a switching operation of a switch device such as a semiconductor device.

The power converter 1 has configuration that generates, transmits or radiates an electromagnetic noise that interferes with electrical components. Hereinafter, an electromagnetic noise may be referred to as a noise. The power converter 1 transmits a noise by a high-frequency current or the like flowing in the electric pathway. For example, a switching power supply is a source of noise. The switching power supply includes an electric circuit that converts voltage and frequency by conduction and interruption of a current with use of a semiconductor. A high frequency energy is generated in such a part where the current is conducted and interrupted. As a result, if the high frequency energy leaks to an outside by being transmitted or radiated, the high frequency energy may cause noise interference. Although the high frequency energy is absorbed by a capacitor or the like, the high frequency energy may be transmitted widely through the busbars 7 and thereby may leak to the outside. Further, the electromagnetic noise can be generated also by a type of switching surge phenomenon in which a current is conducted and interrupted with use of a commutator or the like.

Such electromagnetic noise is transmitted to the electric pathway via the input busbar 71 or the output busbar 72. Further, the electromagnetic noise can be transmitted through the casing 5 from the built-in portion 71b of the input busbar 71 and the built-in portion 72b of the output busbar 72. The electromagnetic noise can be emitted to an inside and an outside of the casing 5.

The lower case 51 is integrated with the input busbar 71 and the output busbar 72. The input busbar 71 and the output busbar 72 are provided in the lower case 51 by being inserted into a mold of the lower case 51 and integrally molded with a resin portion via solidification of a resin surrounding the lower case 51.

The first terminal portion 71a and the second terminal portion 71c of the input busbar 71 are exposed to an outside from the resin portion of the lower case 51. The first terminal portion 71a may be integrally fixed and connected to a terminal block for power input. The built-in portion 71b is a portion that is covered with the resin portion of the lower case 51. The built-in portion 71b is not exposed to the outside. The lower case 51 includes an inner resin 51a and an outer resin 51b. The built-in portion 71b is covered with the inner resin 51a on an inner side of the lower case 51, and the built-in portion 71b is covered with the outer resin 51b on an outer side of the lower case 51. The inner side of the lower case 51 faces the internal space of the lower case 51, and the inner resin 51a is exposed to the internal space. The outer side of the lower case 51 is an outer surface of the lower case 51 that is not exposed to the internal space, and the outer resin 51b is exposed to an external space outside the lower case 51.

The first terminal portion 72a and the second terminal portion 72c of the output busbar 72 are exposed to the outside from the resin portion of the lower case 51. The first terminal portion 72a may be integrally fixed and connected to a terminal block for power output. The built-in portion 72b is a portion that is covered with the resin portion of the lower case 51. The built-in portion 72b is not exposed to the outside. The built-in portion 72b is covered with the inner resin 51a on the inner side of the lower case 51, and an outside of the built-in portion 72b is covered with the outer resin 51b on the outer side of the lower case 51.

The casing 5 of the power converter 1 includes shield layers 61, 62. The shield layers 61, 62 are electrically conductive. The shield layers 61, 62 are provided on an inner surface of the casing 5 such that the shield layers 61, 62 cover the built-in portions 71b, 72b. The shield layers 61, 62 are provided on an outer surface of the casing 5 such that the shield layers 61, 62 cover the built-in portions 71b, 72b. A shield layer 61 has a function of preventing an electromagnetic noise radiated from the built-in portion 71b from leaking out of the casing 5.

The shield layers 61, 62 can be formed, for example, of a metal layer or an alloy layer obtained by plating of a surface of the casing 5. The shield layers 61, 62 may be, for example, copper layers obtained by plating of the surface of the casing 5. According to this configuration, electrical conductivities of the shield layers 61, 62 can be high, and thicknesses of the shield layers 61, 62 can be small. As a result, weights of the shield layers 61, 62 can be small, and the shield layers 61, 62 can be made thinner. The shield layers 61, 62 may be incorporated into the casing 5. In this case, the shield layers 61, 62 are integrally molded with the resin portion of the casing 5 by being inserted into a mold at the time of molding the casing 5.

As shown in FIG. 2, the lower case 51 is provided with a base-side inner layer 61a. The base-side inner layer 61a is provided on the inner surface of the casing 5 such that the base-side inner layer 61a covers the built-in portion 71b. The lower case 51 is provided with a base-side inner layer 62a. The base-side inner layer 62a is provided on the inner surface of the casing 5 such that the base-side inner layer 62a covers the built-in portions 72b. The lower case 51 is provided with a base-side outer layer 61b. The base-side outer layer 61b is provided on the outer surface of the casing 5 such that the base-side outer layer 61b covers the built-in portions 71b. The lower case 51 is provided with a base-side outer layer 62b. The base-side outer layer 62b is provided on the outer surface of the casing 5 such that the base-side outer layer 62b covers the built-in portions 72b.

The base-side inner layer 61a and the base-side inner layer 62a may be overlapped with an entire of an inner surface of the lower case 51 that defines the internal space of the lower case 51. According to this, the base-side inner layers 61a, 62a can more reliably block the electromagnetic noise radiated from a wide area of the inner surface of the lower case 51 into the internal space. The base-side outer layer 61b and the base-side outer layer 62b may be overlapped with an entire of an outer surface of the lower case 51 that faces away form the internal space of the lower case 51. According to this, the base-side outer layer 61b, 62b can more reliably block the electromagnetic noise radiated from a wide area of the outer surface of the lower case 51 into an outer space of the casing 5.

The second case member is the cover 52. A cover-side layer that is electrically conductive is provided on the cover 52. The cover-side layer covers an inner surface or an outer surface of the cover 52. As shown in FIG. 2, the cover 52 may be provided with a cover-side inner layer 52a on the inner surface of the cover 52, and a cover-side outer layer 52b on the outer surface of the cover 52. The cover-side inner layer 52a covers the inner surface of the cover 52 facing the internal space. The cover-side outer layer 52b covers the outer surface of the cover 52 facing away from the internal space.

The cover-side layers 52a, 52b may be incorporated into the cover 52, In this case, the cover-side layers 52a, 52b are integrally molded with a resin portion of the cover 52 by being inserted into a mold at the time of molding the cover 52.

The cover-side seal 15 is interposed between the cover-side inner layer 52a and the base-side inner layers 61a, 62a. The cover-side seal 15 is sandwiched between the cover-side inner layer 52a and the base-side inner layers 61a, 62a and is in contact with both the cover-side inner layer 52a and the base-side inner layers 61a, 62a Since the cover-side seal 15, the cover-side inner layer 52a, and the base-side inner layers 61a, 62a are electrically conductive, an electric current passes between them. Since the cover-side inner layer 52a and the base-side inner layer 61a, 62a form one conductive object, the electromagnetic noise can be dispersed, so that a noise intensity per unit volume can be reduced, By this action, the power converter 1 provides a configuration capable of reducing the electromagnetic noise emitted from the power converter 1.

Actions and effects produced by the power converter 1 according to the first embodiment will be described. The power converter 1 includes the semiconductor modules 2, the capacitor 3 electrically connected to the semiconductor modules 2, the circuit board 4, and the casing 5 accommodating the circuit board 4, the semiconductor modules 2 and the capacitor 3. The power converter 1 includes the busbars 7 each having the input terminal portion, the output terminal portion and the electric pathway connecting the input terminal portion and the output terminal portion. The electric pathway connect to at least one of the semiconductor modules 2 or the capacitor 3. The busbars 7 have the built-in portions 71b, 72b incorporated into the casing 5. The power converter 1 includes the shield layers 61, 62 electrically conductive and provided on the inner surface or the outer surface of the casing 5 such that the shield layers 61, 62 cover the built-in portions 71b, 72b.

According to the power converter 1, since the busbars 7 are a current paths, the built-in portions 71b, 72b of the busbars 7 can emit an electromagnetic noise. In the power converter 1, electromagnetic noises from various noise sources can propagate through the busbars 7 and be emitted from the casing 5. The shield layers 61, 62 provided on the inner surface or the outer surface of the casing 5 such that the shield layers 61, 62 cover the built-in portions 71b, 72b. According to this configuration, the shield layers 61, 62 can prevent emission or diffusion of an electromagnetic noise or the like from the busbars 7 via the casing 5. Therefore, the power converter 1 can suppress a propagation of the electromagnetic noise or the like in air from the busbars 7 through the casing 5. The power converter 1 is capable of reducing noise interference given to, for example, the circuit board or a peripheral device outside the casing 5.

The shield layers 61, 62 are electrically grounded to the mount to which the casing 5 is fixed. According to this configuration, the electromagnetic noise transmitted to the shield layers 61, 62 can be easily released to an outside through the mount. As a result, the effects of reducing noise interference can be enhanced.

In the power converter 1, the shield layers include the base-side inner layers 61a, 62a provided on the inner surface of the casing 5 such that the base-side inner layers 61a, 62a cover the built-in portions 71b, 72b. According to this configuration, the base-side inner layers 61a, 62a can block the electromagnetic noise radiated from the busbars 7 into the internal space of the casing 5. Therefore, the power converter 1 can suppress a propagation of the electromagnetic noise or the like to the inside of the casing 5 from the busbars 7 through the casing 5. As a result, the power converter 1 is capable of reducing noise interference given to electrical components, for example, the circuit board 4 or the capacitor 3.

In the power converter 1, the shield layers include a base-side outer layers 61b, 62b provided on the outer surface of the casing 5 such that the base-side outer layers 61b, 62b are located outward of and cover the built-in portion 71b, 72b. According to this configuration, the base-side outer layers 61b, 62b can block the electromagnetic noise or the Ike radiated from the busbars 7 to the inside and the outside of the casing 5. Therefore, the power converter 1 can suppress a propagation of the electromagnetic noise or the like to the outside of the casing 5 from the busbars 7 through the casing 5. As a result, the power converter 1 is capable of reducing noise interference given to, for example, a peripheral device outside the casing 5.

The shield layers are provided on both the inner surface and the outer surface of the casing 5 such that the shield layers cover the built-in portions 71b, 72b. According to this configuration, the base-side inner layers 61a, 62a and the base-side outer layers 61b, 62b can block the electromagnetic noise radiated from the busbars 7 to the inside and outside of the casing 5. The power converter 1 is capable of reducing noise interference given to electrical components, for example, the circuit board 4, or the capacitor 3 in the casing 5, or a peripheral device outside the casing 5.

The power converter 1 includes the cooling member 11 that cools the semiconductor modules 2, and the cooling side seal 14 electrically conductive that is interposed between the casing 5 and the cooling member 11 for sealing a gap therebetween. The cooling side seal 14 is in contact with the base-side outer layers 61b, 62b that are provided on the casing 5 such that the base-side outer layers 61b, 62b are located outward of and cover the built-in portions 71b, 72b. According to this configuration, the cooling side seal 14 can ensure the sealing of the gap between the casing 5 and the cooling member 11. Further, the base-side outer layers 61b, 62b are adhered to the cooling side seal 14. The cooling side seal 14 is in contact with the base-side outer layers 61b, 62b that are provided on the casing 5 such that the base-side outer layers 61b, 62b are located outward of and cover the built-in portions 71b, 72b.

According to this configuration, the cooling side seal 14 and the base-side outer layers 61b, 62b are capable of increasing a thickness of a member that blocks the electromagnetic noise on a surface of the casing 5 facing the installation support 13. In this way, the power converter 1 is capable of increasing a shielding performance against the electromagnetic noise on the surface of the casing 5 that faces the installation support 16. Further, since the cooling side seal 14 is electrically conductive, the electromagnetic noises accumulated in the base-side outer layer 61b, 62b can flow to the cooling member 11 through the cooling side seal 14. The electromagnetic noise that has flowed into the cooling member 11 is likely to be emitted to the outside from the cooling member 11. Therefore, the power converter 1 is capable of suppressing propagation of the electromagnetic noise or the like to a peripheral device outside the casing 5.

The casing 5 includes the first case member that incorporates the built-in portion and is covered with the shield layers, and the second case member that is attached to the first case member such that the second case member covers an internal space of the first case member. The shield layers include the cover-side layer that is electrically conductive and provided on and covers an inner surface or an outer surface of the second case member. According to this power converter 1, the cover-side layer is capable of blocking the electromagnetic noise or the like propagating in the internal space of the casing 5. As a result, the cover-side layer is capable of reducing radiation of the electromagnetic noise through the second case member to the outside of the casing 5. In this power converter 1, even if the shield layers 61, 62 can not block the electromagnetic noise, and the electromagnetic noise is radiated into the internal space, the cover-side layer can block the electromagnetic noise or the like and prevent radiation of the electromagnetic noise from the internal space to the outside of the casing 5.

The cover-side outer layer 52b is provided on and covers the outer surface of the second case member. According to this power converter, the cover-side outer layer is capable of blocking the electromagnetic noise or the like transmitted in the second case member from the internal space of the casing 5 on the outer surface of the second case member.

The cover-side inner layer 52a is provided on and covers the inner surface of the second case member. According to this power converter, the cover-side inner layer is capable of blocking the electromagnetic noise or the like propagating in the internal space on the inner surface of the second case member, thereby preventing transmission of the electromagnetic noise into the second case member.

The cover-side layers are provided on the inner surface and the outer surface of the second case member. This power converter is capable of blocking the electromagnetic noise or the like transmitted from the internal space of the casing 5 to the second case member on the inner surface and the outer surface of the second case member. That is, the power converter is capable of blocking the electromagnetic noise in two stages. Therefore, in the power converter, effects of reducing emission of the electromagnetic noise to the outside of the casing 5 through the second case member can be increased drastically.

The power converter 1 includes the cover-side seal 15 electrically conductive and interposed between the first case member and the second case member for sealing a gap therebetween. The shield layer includes the base-side inner layers 61a, 62a that are provided on an inner surface of the first case member such that the base-side inner layers 61a, 62a cover the built-in portions 71b, 72b. The cover-side seal 15 is in contact with the base-side inner layers 61a, 62a and the cover-side inner layer 52a provided on the inner surface of the second case member.

According to this configuration, the cover-side seal 15 can ensure sealing of the gap between the first case member and the second case member. Further, the cover-side seal 15 is adhered to the cover-side inner layer 52a and the base-side inner layers 61a, 62a. Therefore, the electromagnetic noise accumulated in the casing 5 can be blocked by the cover-side seal 15, the cover-side inner layer 52a, and the base-side inner layers 61a, 62a Therefore, the power converter 1 is capable of suppressing propagation of the electromagnetic noise or the like into the internal space of the casing 5.

Second Embodiment

A second embodiment will be described with reference to FIG. 3. A power converter 101 of the second embodiment is different from the first embodiment in a cover-side layer, a shield layer 161 and a shield layer 162. Configurations, actions, and effects not specifically described in the second embodiment are the same as those in the first embodiment, and points different from the first embodiment will be described below.

Figure 3:
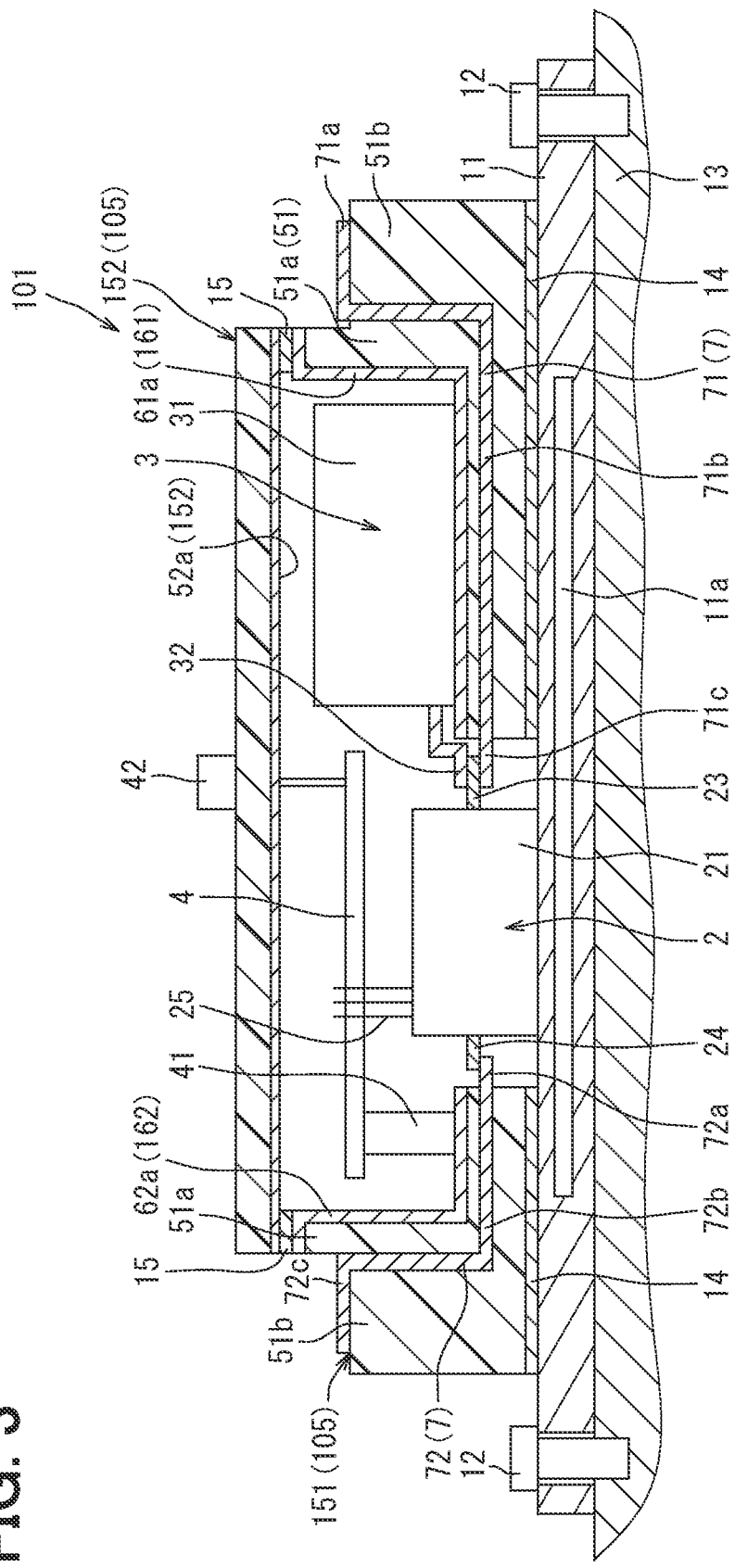
FIG. 3 is a cross-sectional view illustrating a configuration of a power converter according to a second embodiment.

As shown in FIG. 3, a casing 105 includes a lower case 151 and a cover 152. The cover-side layer includes the cover-side inner layer 52a provided on and covering an inner surface of the cover 152. The cover 152 is not provided with a shield layer on an outer surface of the cover 152. The shield layer 161 includes a base-side inner layer 61a provided on and covering an inner surface of the lower case 151. The lower case 151 is not provided with the base-side outer layer provided on an outer surface of the lower case 151. The shield layer 162 includes a base-side inner layer 62a provided on the inner surface of the lower case 151. A cooling side seal 14 is provided between the lower case 151 and the cooling member 11. The cooling side seal 14 is deformed to seal a gap between the lower case 151 and the cooling member 11.

According to the second embodiment, the power converter 101 includes, as shield layers, the base-side inner layers 61a, 62a provided on the inner surface of the lower case 151 such that the base-side inner layers 61a, 62a cover the built-in portions 71b, 72b. According to this configuration, the base-side inner layers 61a, 62a can block an electromagnetic noise radiated from the busbars 7 into an internal space of the casing 105. Therefore, the power converter 101 is capable of suppressing propagation of the electromagnetic noise or the like to an inside of the casing 105 from the busbars 7 through the casing 105. As a result, the power converter 101 is capable of reducing noise interference to electrical components, for example, a circuit board 4 or a capacitor 3.

The cover-side inner layer 52a is provided on and covers the inner surface of the cover 152. According to this power converter 101, the cover-side inner layer 52a is capable of blocking the electromagnetic noise or the like propagating in the internal space of the casing 105 on the inner surface of the cover 152. As a result, transmission of the electromagnetic noise in the cover 152 can be prevented.

Third Embodiment

A third embodiment will be described with reference to FIG. 4. A power converter 201 of the third embodiment is different from the first embodiment in a cover-side layer, a shield layer 261 and a shield layer 262. Configurations, actions, and effects not specifically described in the third embodiment are the same as those in the first embodiment, and points different from the first embodiment will be described below.

Figure 4:
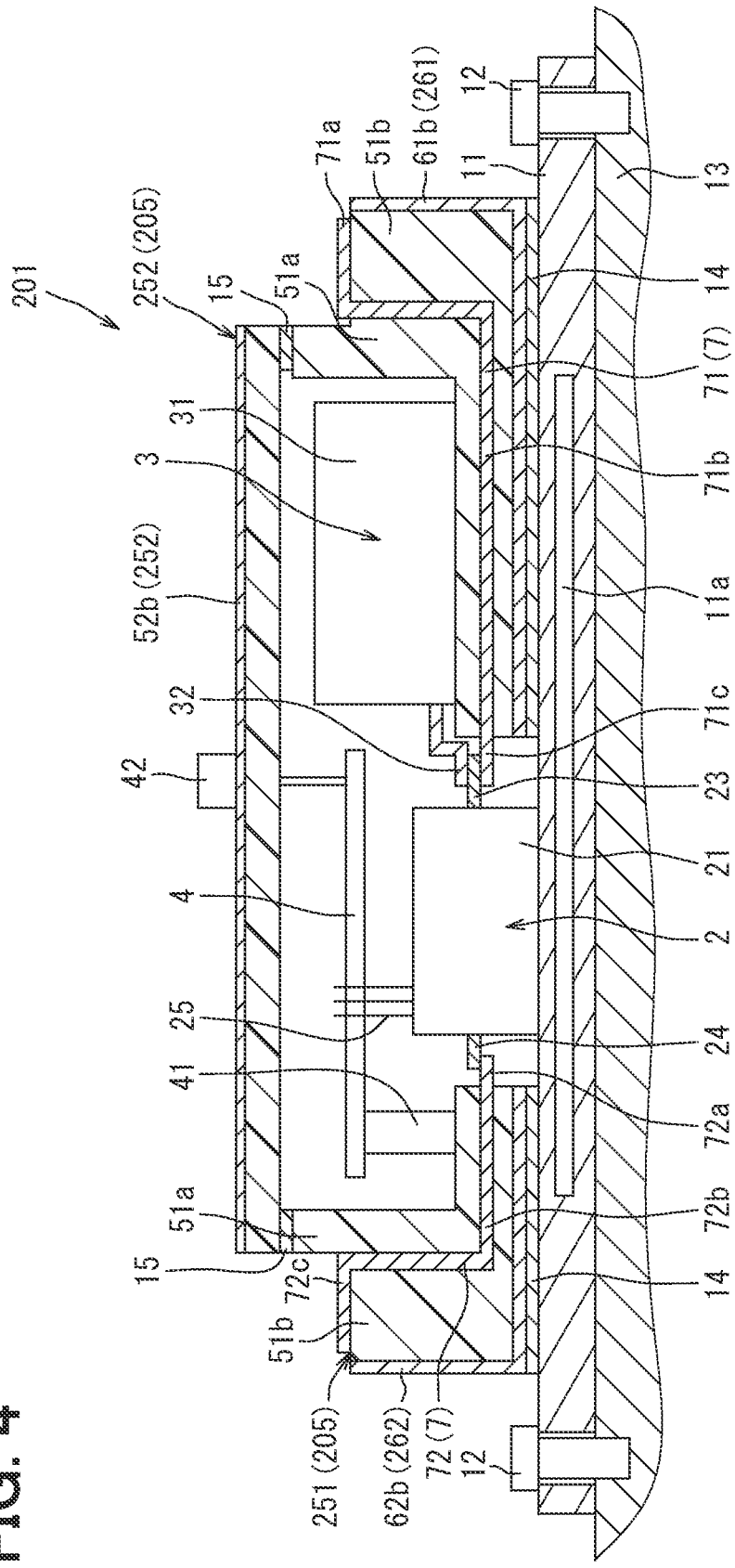
FIG. 4 is a cross-sectional view illustrating a configuration of a power converter according to a third embodiment.

As shown in FIG. 4, a casing 205 includes a lower case 251 and a cover 252. The cover-side layer includes a cover-side outer layer 52b provided on and covering an outer surface of the cover 252. The cover 252 is not provided with a shield layer provided on an inner surface of the cover 252. The shield layer 261 includes a base-side outer layer 61b provided on and covering an outer surface of the lower case 151. The lower case 251 is not provided with a base-side inner layer provided on an inner surface of the lower case 251. The shield layer 262 includes a base-side outer layer 62b provided on and covering an outer surface of the lower case 151.

According to the third embodiment, the power converter 201 includes, as the shield layers, the base-side outer layers 61b, 62b provided on the outer surface of the lower case 251 such that the base-side outer layers 61b, 62b cover the built-in portions 71b, 72b. According to this configuration, the base-side outer layers 61b, 62b can block radiation of an electromagnetic noise from the busbars 7 to surroundings of the casing 205. Therefore, the power converter 201 is capable of suppressing propagation of the electromagnetic noise or the like to an outside of the casing 205 from the busbars 7 through the casing 205. As a result, the power converter 201 is capable of reducing noise interference given to, for example, a peripheral device outside the casing 205.

The cover-side outer layer 52b is provided on and covering the outer surface of the cover 252. According to this power converter 201, the cover-side outer layer is capable of blocking the electromagnetic noise or the like transmitted in the cover 252 from the internal space of the casing 205 on the outer surface of the cover 252.

Other Embodiments

The disclosure of this specification is not limited to the illustrated embodiment. The disclosure encompasses the illustrated embodiments and variations based on the embodiments by those skilled in the art. For example, the disclosure is not limited to the combinations of components and elements shown in the embodiments, and various modifications and implementations can be performed. The disclosure may be implemented in various combinations. The disclosure may have additional portions that may be added to the embodiments. The disclosure includes the embodiments from which the parts and the components are omitted. The disclosure encompasses the replacement or combination of components, elements between one embodiment and another. The disclosed technical scope is not limited to the description of the embodiment. It should be understood that the disclosed technical scope is defined in claims and includes meanings equivalent to the claims and all modifications in the scope of the claims.

The power converter and shield layer disclosed in the specification is not limited to the examples shown in the above embodiments. For example, the power converter includes a device having the following configurations. The cover of the second embodiment may not be provided with the cover-side inner layer 52a on the inner surface of the cover. The cover of the third embodiment may not be provided with the cover-side outer layer 52b on the outer surface of the cover. The cover of the first embodiment may not be provided with the cover-side inner layer 52a on the inner surface of the cover. The cover of the first embodiment may not be provided with the cover-side outer layer 52b on the outer surface of the cover. The cover of the first embodiment may not be provided with the shield layer.

While the present disclosure has been described with reference to embodiments thereof, it is to be understood that the disclosure is not limited to the embodiments and constructions. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

The invention claimed is:

1. A power converter comprising:
semiconductor modules;
a capacitor electrically connected to the semiconductor modules;
a circuit board;
a casing accommodating the circuit board, the semiconductor modules and the capacitor;
a busbar having an input terminal portion, an output terminal portion and an electric pathway connecting the input terminal portion and the output terminal portion, the electric pathway being connected to at least one of electronic components including the semiconductor modules and the capacitor, the busbar having a built-in portion incorporated into the casing;
a shield layer electrically conductive and provided on an inner surface or an outer surface of the casing such that the shield layer covers the built-in portion;
a cooling member configured to cool the semiconductor modules; and
a cooling side seal electrically conductive and interposed between the casing and the cooling member for sealing a gap between the casing and the cooling member, wherein
the shield layer includes an outer layer provided on the outer surface of the casing such that the outer layer covers the built-in portion, and
the cooling side seal is in contact with the outer layer.

2. The power converter according to claim 1, wherein
the casing includes a first case member that incorporates the built-in portion and is provided with the outer layer of the shield layer, and a second case member that is attached to the first case member such that the second case member covers an internal space of the first case member, and
the shield layer includes a cover-side layer that is electrically conductive and provided on and covers an inner surface or an outer surface of the second case member.

3. The power converter according to claim 2, wherein
the cover-side layer includes a cover-side outer layer provided on and covers the outer surface of the second case member.

4. The power converter according to claim 2, wherein
the cover-side layer includes a cover-side inner layer provided on and covers the inner surface of the second case member.

5. The power converter according to claim 2, wherein
the cover-side layer includes a cover-side inner layer provided on and covers the inner surface of the second case member, and a cover-side outer layer provided on and covers the outer surface of the second case member.

6. The power converter according to claim 4, comprising
a cover-side seal electrically conductive and interposed between the first case member and the second case member for sealing a gap between the first case member and the second case member, wherein
the shield layer includes a base-side inner layer provided on an inner surface of the first case member such that the base-side inner layer covers the built-in portion, and the cover-side seal is in contact with the base-side inner layer and the cover-side inner layer.

7. The power converter according to claim 1, wherein the shield layer is electrically grounded to a mount to which the casing is fixed.

8. The power converter according to claim 1, wherein the shield layer includes a base-side inner layer provided on an inner surface of the casing such that the base-side inner layer covers the built-in portion.

9. A power converter comprising:
semiconductor modules;
a capacitor electrically connected to the semiconductor modules;
a circuit board;
a casing accommodating the circuit board, the semiconductor modules and the capacitor;
a busbar having an input terminal portion, an output terminal portion and an electric pathway connecting the input terminal portion and the output terminal portion, the electric pathway being connected to at least one of electronic components including the semiconductor modules and the capacitor, the busbar having a built-in portion incorporated into the casing;
a shield layer electrically conductive and provided on an inner surface or an outer surface of the casing such that the shield layer covers the built-in portion;
a cooling member configured to cool the semiconductor modules; and
a cooling side seal electrically conductive and interposed between the casing and the cooling member for sealing a gap between the casing and the cooling member, wherein
the shield layer includes an inner layer provided on the inner surface of the casing, and an outer layer provided on the outer surface of the casing such that the inner layer and the outer layer cover the built-in portion, and
the cooling side seal is in contact with the outer layer.

10. A power converter, comprising:
semiconductor modules;
a capacitor electrically connected to the semiconductor modules;
a circuit board;
a casing accommodating the circuit board, the semiconductor modules and the capacitor, the casing including a first case member and a second case member attached to the first case member such that the second case member covers an internal space of the first case member;
a busbar having an input terminal portion, an output terminal portion and an electric pathway connecting the input terminal portion and the output terminal portion, the electric pathway being connected to at least one of electronic components including the semiconductor modules and the capacitor, the busbar having a built-in portion incorporated into the first case member of the casing;
a shield layer electrically conductive and provided on an inner surface or an outer surface of the casing such that the shield layer covers the built-in portion; and
a cover-side seal electrically conductive and interposed between the first case member and the second case member for sealing a gap between the first case member and the second case member, wherein
the shield layer includes a cover-side inner layer that is provided on and covers the inner surface of the second case member, the shield layer includes a base-side inner layer provided on an inner surface of the first case member such that the base-side inner layer covers the built-in portion, and
the cover-side seal is in contact with the base-side inner layer and the cover-side inner layer.

11. The power converter according to claim 10, wherein the shield layer includes a base-side outer layer provided on the outer surface of the casing such that the base-side outer layer covers the built-in portion.

12. A power converter comprising:
semiconductor modules;
a capacitor electrically connected to the semiconductor modules;
a circuit board;
a casing accommodating the circuit board, the semiconductor modules and the capacitor, the casing including a first case member and a second case member attached to the first case member such that the second case member covers an internal space of the first case member;
a busbar having an input terminal portion, an output terminal portion and an electric pathway connecting the input terminal portion and the output terminal portion, the electric pathway being connected to at least one of electronic components including the semiconductor modules and the capacitor, the busbar having a built-in portion incorporated into the first case member of the casing;
a shield layer electrically conductive and provided on an inner surface or an outer surface of the casing such that the shield layer covers the built-in portion; and
a cover-side seal electrically conductive and interposed between the first case member and the second case member for sealing a gap between the first case member and the second case member, wherein
the shield layer includes a cover-side inner layer that is provided on and covers an inner surface of the second case member, and a cover-side outer layer that is provided on and covers an outer surface of the second case member,
the shield layer includes a base-side inner layer provided on an inner surface of the first case member such that the base-side inner layer covers the built-in portion, and
the cover-side seal is in contact with the base-side inner layer and the cover-side inner layer.

13. A power converter comprising:
semiconductor modules;
a capacitor electrically connected to the semiconductor modules;
a casing accommodating the semiconductor modules and the capacitor;
a busbar connected to at least one of electronic components including the semiconductor modules and the capacitor; and
a shield layer that is electrically conductive and is provided on the casing, wherein
the busbar includes a terminal portion connected to both a terminal of the capacitor and an input terminal of the semiconductor modules, and
the terminal portion of the busbar is connected to the terminal of the capacitor through the input terminal of the semiconductor modules.

14. The power converter according to claim 13, wherein the input terminal of the semiconductor modules is provided between the terminal of the capacitor and the terminal portion of the busbar.

15. The power converter according to claim 13, further comprising
- a cooling member configured to cool the semiconductor modules; and
- at least a part of the busbar is provided between the capacitor and the cooling member.

16. The power converter according to claim 14, wherein the input terminal of the semiconductor modules is in contact with both the terminal of the capacitor and the terminal portion of the busbar.

17. The power converter according to claim 13, wherein
- the terminal portion of the busbar and the terminal of the capacitor extend in a first direction,
- the input terminal of the semiconductor modules extends in a second direction opposite to the first direction, and
- the input terminal of the semiconductor modules is interposed between the terminal portion of the busbar and the terminal of the capacitor in a direction perpendicular to the first direction and the second direction.

* * * * *